(12) United States Patent
Lin et al.

(10) Patent No.: US 8,790,984 B2
(45) Date of Patent: Jul. 29, 2014

(54) HIGH-BETA BIPOLAR JUNCTION TRANSISTOR AND METHOD OF MANUFACTURE

(71) Applicant: Macronix International Co., Ltd., Hsinchu (TW)

(72) Inventors: Cheng-Chi Lin, Yilan County (TW); Shuo-Lun Tu, Hsin-Chu (TW); Shih-Chin Lien, Taipei County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/842,236

(22) Filed: Mar. 15, 2013

(65) Prior Publication Data

US 2013/0207236 A1  Aug. 15, 2013

Related U.S. Application Data

(62) Division of application No. 12/723,953, filed on Mar. 15, 2010, now Pat. No. 8,421,124.

(30) Foreign Application Priority Data

Jan. 13, 2010 (TW) .............................. 99100825 A

(51) Int. Cl.
*H01L 29/66* (2006.01)
(52) U.S. Cl.
USPC ........................... 438/309; 438/235; 438/312
(58) Field of Classification Search
CPC .............. H01L 29/66136; H01L 29/66; H01L 29/7378; H01L 29/0821
USPC ......................................... 438/309, 235, 312
See application file for complete search history.

(56) References Cited

U.S. PATENT DOCUMENTS 5,756,387 A  5/1998 Villa et al.

*Primary Examiner* — Samuel Gebremariam
(74) *Attorney, Agent, or Firm* — Stout, Uxa, Buyan & Mullins; Frank J. Uxa

(57) ABSTRACT

An NPN bipolar junction transistor is disclosed that exhibits a collector-to-emitter breakdown voltage greater than 10 volts and a beta greater than 300. The large value of beta is obtained by fabricating the transistor with an extra N-type layer that reduces recombination of electrons and holes.

7 Claims, 13 Drawing Sheets

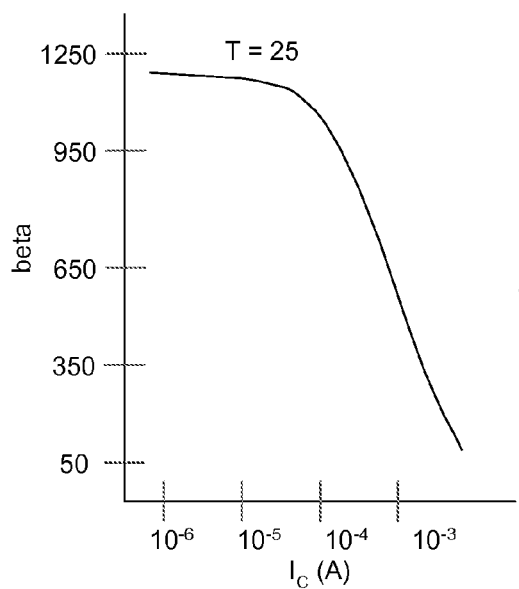 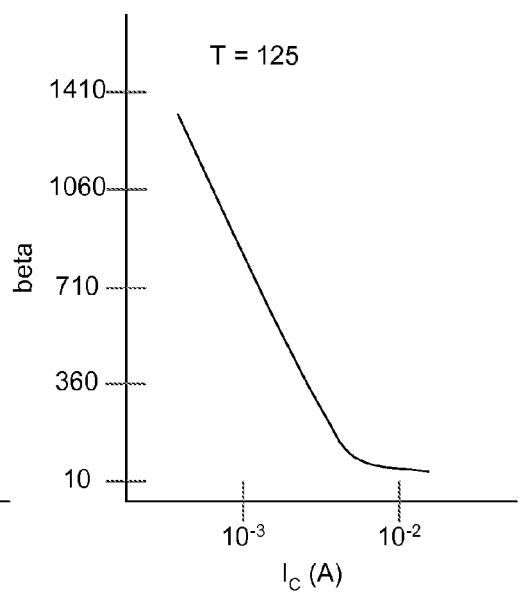
FIG. 7A    FIG. 7B

HIGH-BETA BIPOLAR JUNCTION TRANSISTOR AND METHOD OF MANUFACTURE

CROSS-REFERENCE TO RELATED APPLICATIONS

This application is a divisional of U.S. application Ser. No. 12/723,953, filed on Mar. 15, 2010 and entitled HIGH-BETA BIPOLAR JUNCTION TRANSISTOR AND METHOD OF MANUFACTURE, which claims priority to Taiwan Patent Application No. 099100825, filed on Jan. 13, 2010, the entire contents both of which are incorporated herein by reference.

BACKGROUND OF THE INVENTION

1. Field of the Invention

The embodiments of the present invention relate generally to semiconductor devices and, more particularly, to high-gain bipolar junction transistors.

2. Description of Related Art

Bipolar junction transistors (BJTs) are three-terminal devices having emitter, base, and collector terminals. In typical common-emitter applications, a relatively small base (input) current controls a relatively large collector (output) current. Whether in power or small-signal applications, a large ratio of change in collector current to change in base current is desirable, this ratio often being referred to as $h_{FE}$ or $\beta$. A BJT also exhibits breakdown voltages often described as collector-base breakdown voltage, $BV_{CBO}$ and a collector-to-emitter breakdown voltage, $BV_{CEO}$. These three parameters, $\beta$, $BV_{CBO}$ and $BV_{CEO}$ are not independent but rather are interrelated by structural limitations of physical devices. For example, with $BV_{CBO}$ held constant, $\beta$ varies inversely with $BV_{CEO}$, while $\beta$ varies directly with $BV_{CBO}$ when $BV_{CEO}$ is held constant. These interrelationships place an upper limit on attainable values of $\beta$ when prior-art methods are used to fabricate NPN BJTs having specified breakdown voltage limits.

A need thus exists in the prior art for a method of manufacture that produces an NPN BJT having high values of $\beta$ even with large values of $BV_{CEO}$.

SUMMARY OF THE INVENTION

The embodiments of the present invention address these needs by providing bipolar junction transistor having a high beta and a collector-to-emitter breakdown voltage exceeding 10 volts. An embodiment of the invention herein disclosed comprises a substrate having a first well disposed therein and having a first depth, the first welt having a first conductivity type. A second well having a shape of a rectangular ring and surrounding a center portion of the first well being of the first conductivity type may be disposed in the first well, the second well having a second depth less than the first depth and being doped to a higher concentration than that of the first well. A third well having a second conductivity type may be disposed in the first well, in (e.g., filling) a center portion of the second well and being formed to about the second depth with an upper surface of the third well being aligned with an upper surface of the second well. The embodiment, further, may comprise a layer having the first conductivity type in an upper portion of the third well, the layer having a thickness less than the second depth, and an upper surface of the layer may be aligned with the upper surface of the second well. Another embodiment of the present invention may further comprise an emitter region having a rectangular shape disposed in a center portion of the layer, the emitter region having the first conductivity type, and being doped to a higher concentration than that of the layer. The emitter region may extend through the layer into the third well. The embodiment may also comprise a base region having a shape of a rectangular ring of the second conductivity type surrounding, separated from, and concentric with the emitter region, the base region being doped to a higher concentration than that of the third well and extending through the layer into the third well. The embodiment, further, may comprise a collector region having a shape of a rectangular ring of the first conductivity type surrounding, separated from, and concentric with the base region, the collector region being doped to a higher concentration than that of the layer. The collector region may extend through the layer into the third well.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 7A is a chart describing dependence of beta on collector current at a temperature of 25 degrees C. according to an embodiment of the present invention;

FIG. 7B is a chart describing dependence of beta on collector current at a temperature of 125 degrees C. according to an embodiment of the present invention;

DETAILED DESCRIPTION OF THE PRESENTLY PREFERRED EMBODIMENTS

Figure 1A:
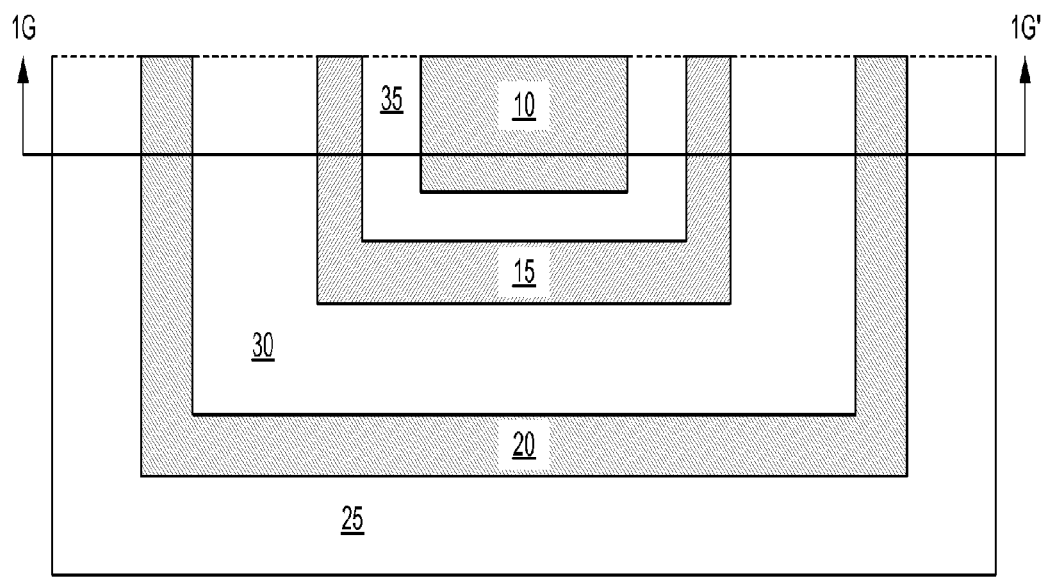
FIG. 1A is a top view of an NPN bipolar junction transistor fabricated according to a method of the present invention.

Reference will now be made in detail to the presently preferred embodiments of the invention, examples of which are illustrated in the accompanying drawings instances of which are to be interpreted to be to scale in some implementations while in other implementations, for each instance, not. In certain aspects use of like or the same reference designators in the drawings and description refers to the same, similar or analogous components and/or elements, while according to other implementations the same use should not. According to certain implementations use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a bipolar junction transistor and a related method of manufacture.

Figure 1B:
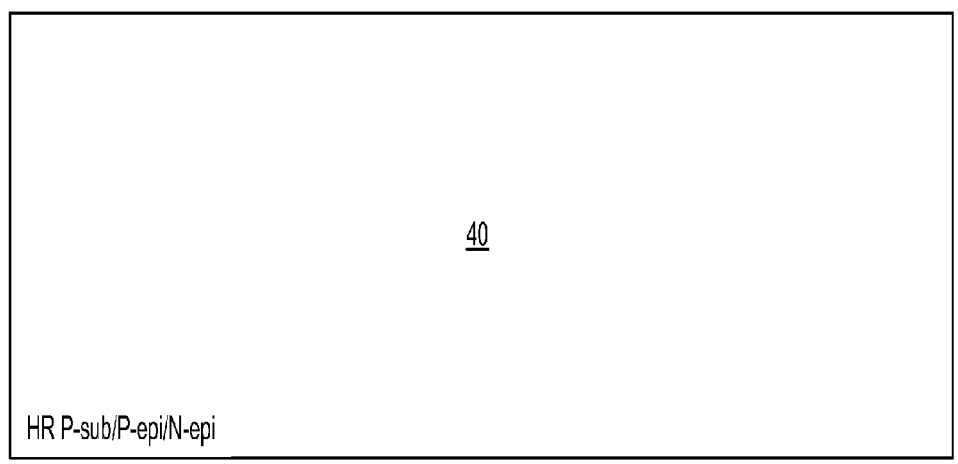
FIG. 1B is a cross-sectional diagram of a base wafer.
Figure 1C:
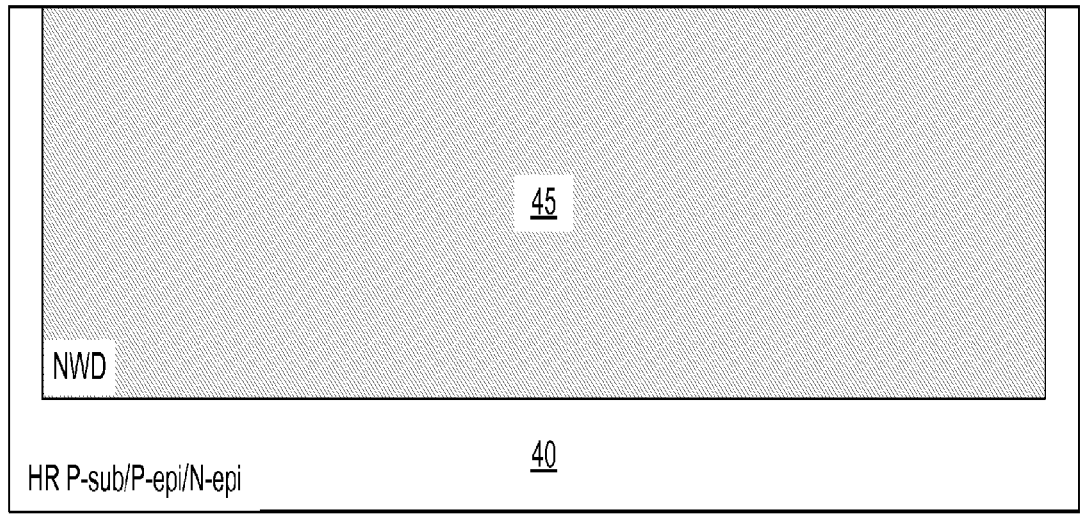
FIG. 1C is a cross-sectional diagram of the base wafer after deep implantation of an N-well.
Figure 1D:
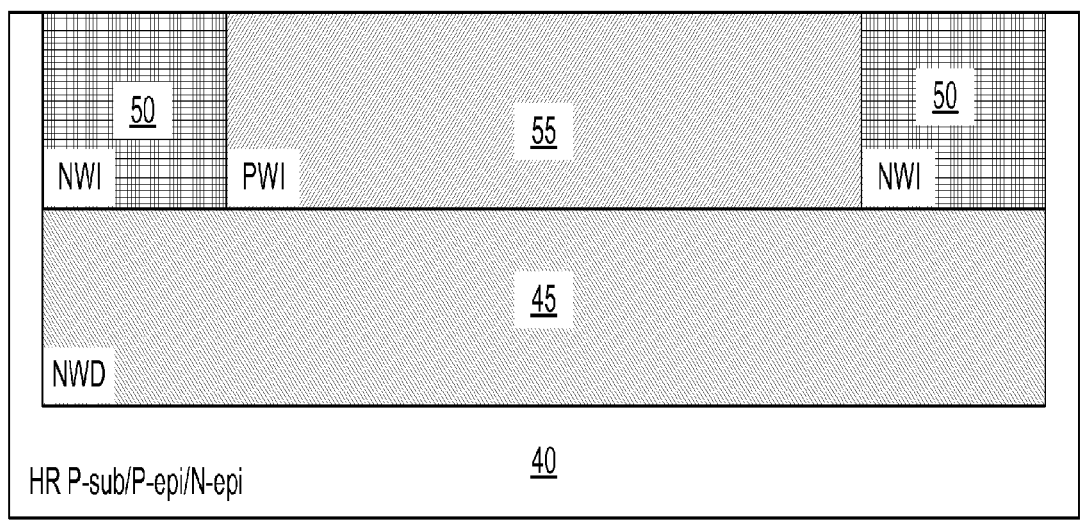
FIG. 1D is a cross-sectional diagram of the structure of FIG. 1C after implantation of a P-well and an N-well.
Figure 1E:
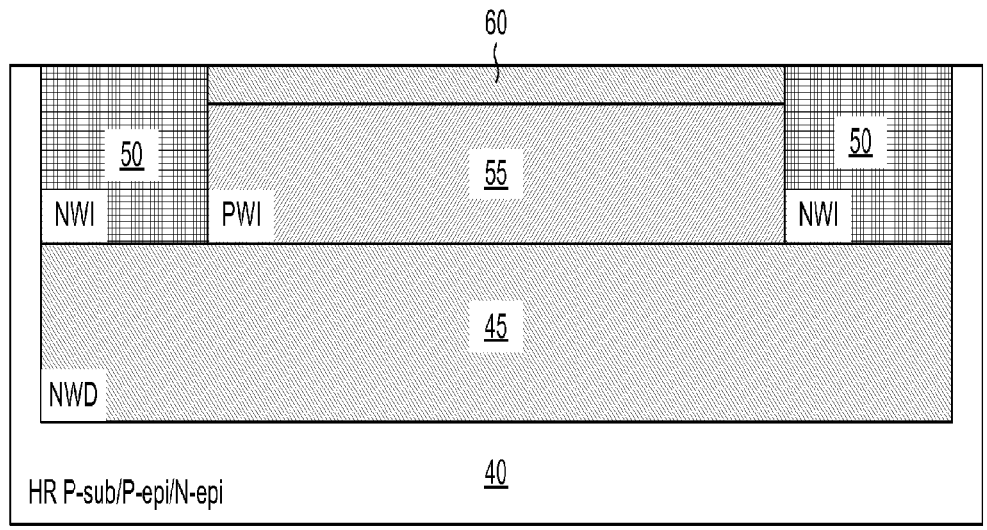
FIG. 1E is a cross-sectional diagram of the structure of FIG. 1D after forming of an N-type layer above the P-well.

Referring more particularly to the drawings, FIG. 1A is a top view of an embodiment of an NPN bipolar junction transistor (BJT) fabricated in accordance with the embodiments of the present invention. The illustrated embodiment, which is described below and illustrated in cross-section in FIG. 1G, comprises an active area including an emitter region 10 having a nominally rectangular boundary and a complementarily shaped base region 15 with rectangular boundary/ring that surrounds and is concentric with the emitter region 10. A collector region 20 likewise has nominal shape of a rectangular ring and is oriented concentrically around the base region 15. The embodiment further comprises isolation regions 25, 30, and 35, which may be formed of a field oxide and which may separate collector/base and base/emitter regions of an active area of the device. An outer dimension of the structure of FIG. 1A may be about 40 microns. The emitter region 10 may have a width of about 10 microns, and the rectangular ring that forms the surrounding base region 15 may extend over a width of about 20 microns being formed of a strip about 3 microns wide. Similarly, the collector region 20 may be formed of a strip about 3 microns wide that extends over a width of about 35 microns. The resulting structure may exhibit a high beta (i.e., ratio of collector current, $I_C$, to base current $I_B$, $I_C/I_B$) white, at the same time, having a relatively high breakdown voltage $BV_{CEO}>10$ V), The illustrated BJT may be fabricated according to a process such as that diagrammed in FIGS. 1B-1G. Beginning with FIG. 1B, a substrate is formed in a base wafer 40, which may comprise high-resistance material such as a P-type substrate or P- or N-type epitaxial material. Turning to FIG. 1C, a region of the base wafer 40 may be implanted with atoms of a first conductivity type, e.g., an N-type dopant such as phosphorus, at a concentration from about $10^{12}$ to $10^{14}$, an example being $10^{13}$, atoms/cm$^2$, and the structure exposed to a high temperature (e.g., from about 1000 to 1200, an example being 1150, degrees C.) may be applied for an extended time (e.g., about 12 hours) to drive-in the N-type dopant to form a deep N-well (NWD) 45, i.e., a first well, having a depth from about 5 to 9, an example being 7, microns and a dopant concentration from about $10^{15}$ to $10^{17}$, an example being $10^{16}$, atoms/cm$^3$. When viewed from above (cf. FIG. 1A), the N-well 45 may form a rectangle, i.e., a first rectangle. The structure of FIG. 1C may be appropriately masked with photoresist and patterned to expose an area that, pursuant to forming an N-well implant (NWI) 50, i.e., a second well as illustrated in FIG. 1D, may be implanted with atoms of an N-type dopant (e.g., phosphorus) at a concentration from about $10^{12}$ to $10^{14}$, an example being $6\times10^{12}$, atoms/cm$^2$ and disposed to surround a center portion of the NWD 45. Further, in order to commence formation of a third well, a structure internal to the NWI 50, which structure may fill the center portion of the NWD 45, may be formed. That is, the center portion of the NWD 45 may be photoresist/patterned, and atoms of a second conductivity type, e.g., a P-type dopant such as boron, may be implanted at a concentration from about $10^{12}$ to $10^{14}$, an example being $10^{13}$, atoms/cm$^2$ to form the third well. The third well, which may be referred to as a P-well implant (PWI) 55, may be exposed to a high temperature (e.g., from about 1000 to 1200, an example being 1150, degrees C.) for an extended time (e.g., about 4 hours) to drive-in the N-type dopant and the P-type dopant to form the NWI 50 and the PWI 55. The NWI 50 may have a depth from about 2 to 4, an example being 3, microns and may be doped to a higher concentration than that of the first well, from about $10^{15}$ to $10^{17}$, an example being $2\times10^{16}$, atoms/cm$^3$. When viewed from above (i.e., from the perspective of FIG. 1A), the NWI 50 may form a rectangular ring disposed, e.g., inside the first rectangle, just inside edges of the wafer 40 and may have a nominal width of about 8 microns. The third well, i.e., the PWI 55, may have a depth from about 2 to 4, an example being 3 microns with a dopant concentration from about $10^{15}$ to $10^{17}$, an example being $3\times10^{16}$, atoms/cm$^3$. When viewed from above, the PWI 55 may form a rectangle, i.e., a second rectangle. A layer having the first conductivity type, e.g., an N-type layer 60, may then be formed above the PWI 55 by adding an extra dopant of the first conductivity type, e.g., an N-type dopant such as phosphorous or arsenic, after the drive-in of the N-type dopant and the P-type dopant that form the NWI 50 and the PWI 55 as shown in FIG. 1E. Alternatively, the N-type layer 60 may be formed by adjusting the net doping (i.e., net concentration) of the NWD 45 and PWI 55 to form the N-type layer 60. Detail 250 in FIG. 4C, which is described below, illustrates net N-type doping that may form the N-type layer 60 at the surface of the PWI 55.

Figure 1F:
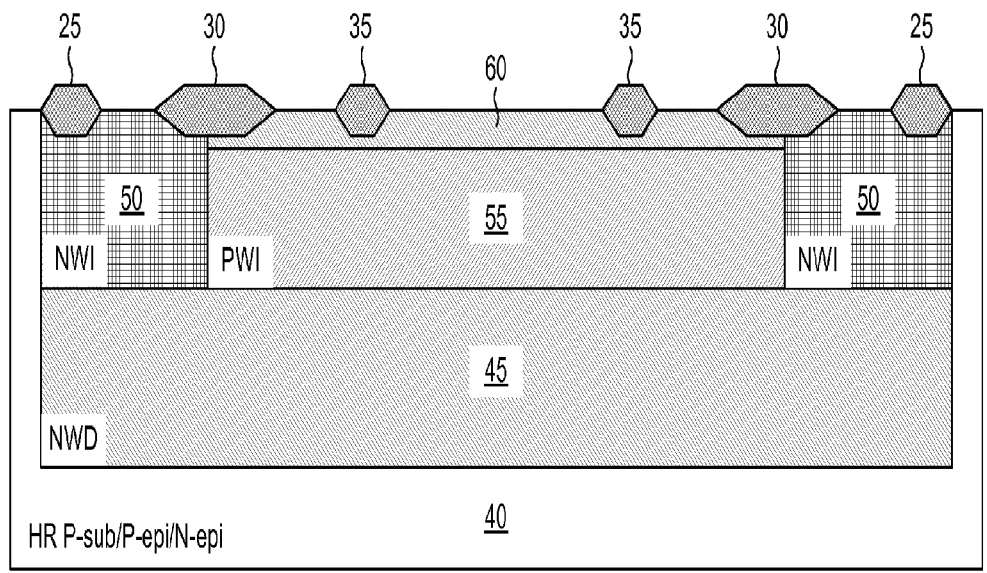
FIG. 1F is a cross-sectional diagram of the structure of FIG. 1E after performing of a field oxide process to define isolation and active areas.
Figure 1G:
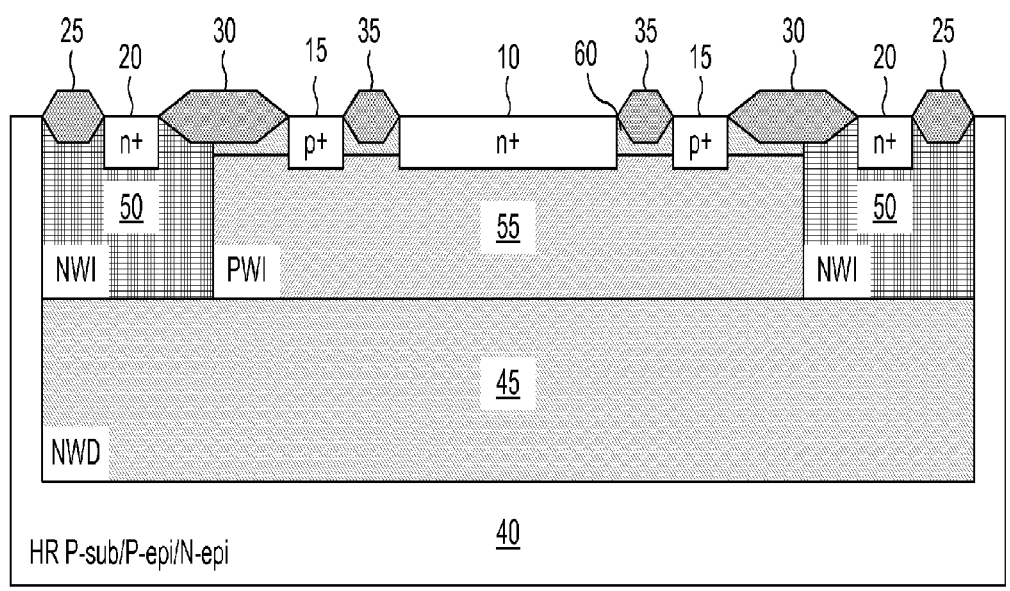
FIG. 1G is a cross-sectional view of the structure of FIG. 1A taken along line 1G-1G'.

A field oxide process may be performed to generate field oxide material 25 (e.g., silicon dioxide) on the structure of FIG. 1E in order, subsequently, to define and separate active areas from isolation areas 25, 30, and 35, as illustrated in FIGS. 1F and 1A. The active areas may be photoresist/patterned and implanted as shown in FIG. 1G with atoms of a dopant of the first conductivity type, e.g., an N-type dopant such as arsenic, to form a center rectangular N+ emitter region 10 and an N+ collector region 20, which may have a shape of a rectangular region nominally concentric with the emitter region 10 (cf. FIGS. 1A and 1G). The emitter region 10 and the collector region 20 may be doped to a higher concentration than that of the N-type layer 60, e.g., a concentration ranging from about $10^{19}$ to $10^{21}$, an example being $2 \times 10^{20}$, atoms/cm$^3$, extending to a depth from about 0.1 to 0.5, an example being 0.3, microns. A P+ base region 15 (FIG. 1G) may be formed by photoresist/patterning another region having a shape of a rectangular ring disposed between the emitter region 10 and the collector region 20 and implanting the region with atoms of a second conductivity type, e.g., a P-type dopant such as boron, to a depth from about 0.1 to 0.5, an example being 0.3, microns such that the base region 15 is doped to a higher concentration than that of the third well, ranging from about $10^{19}$ to $10^{21}$, an example being $10^{20}$, atoms/cm$^3$.

Figure 2:
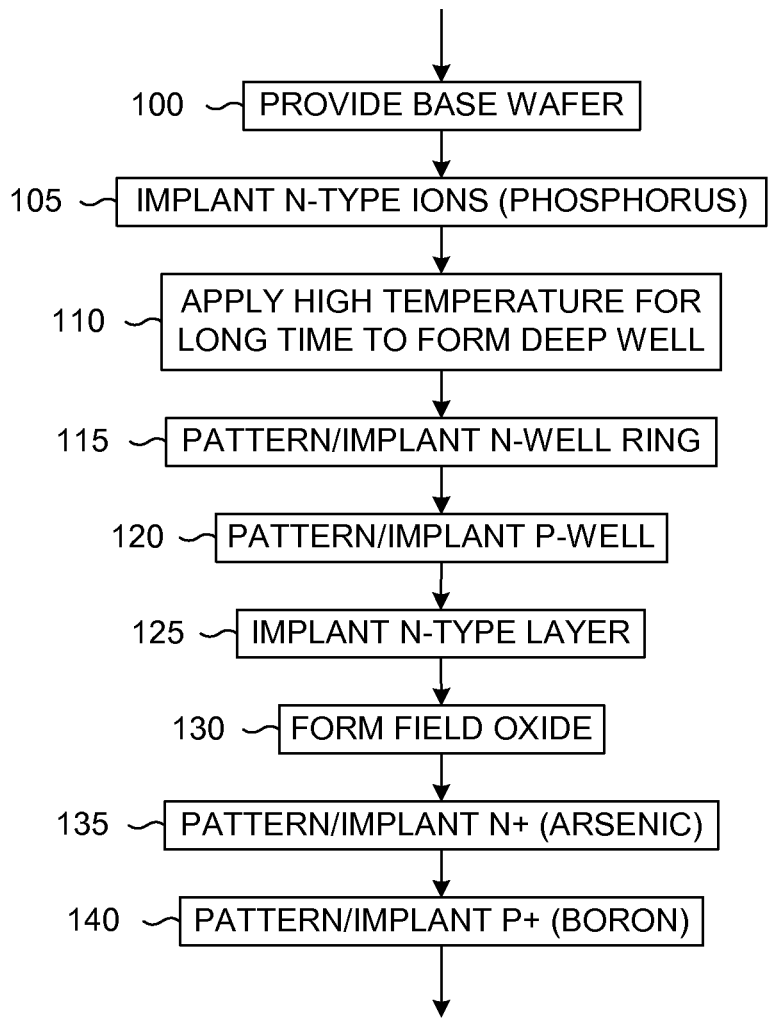
FIG. 2 is a flow diagram illustrating an implementation of the method of the present invention.

According to an aspect of the present invention, a method, an implementation of which is summarized as a flow diagram in FIG. 2, may be employed to fabricate a high-beta BJT that exhibits a high breakdown voltage. According the illustrated implementation, a base wafer is provided at step 100. The base wafer may comprise a high-resistance P-type, P-type epitaxial, N-type epitaxial material as discussed above with reference to FIG. 1B. At step 105 the base wafer may be implanted with atoms of an N-type material, i.e., dopant such as, e.g., phosphorus, in a shape of a first rectangle. The resulting structure at step 110 may then be subjected to a high temperature (e.g., from about 1000 to 1200, an example being 1150, degrees C.) for an extended time (e.g., from about 4 to 20, an example being 12, hours) to drive the implanted atoms to a depth sufficient to form the NWD 45 (FIG. 1C), i.e., the first well, in the wafer (e.g., a depth ranging from about 5 to 9, an example being 7, microns) at a &pant concentration from about $10^{15}$ to $10^{17}$, an example being $10^{16}$, atoms/cm$^3$. The NWI 50 (FIG. 1D), i.e., the second well, having a nominal shape of a rectangular ring, may then be formed inside edges of the first rectangle at step 115 by depositing photoresist, patterning, and implanting atoms of N-type material such as phosphorus. The PWI 55 (FIG. 1D), the third well, then may be formed inside the NWI 50 by depositing photoresist, patterning, and implanting atoms of P-type material such as boron at step 120. At step 122 the N-type and P-type implants performed at, respectively, steps 115 and 120 may be subjected to a high temperature (e.g., from about 1000 to 1200, an example being 1150, degrees C.) for an extended time (e.g., from about 1 to 10, an example being 4, hours) to drive the implanted atoms to a depth to form the NWI 50 and PWI 55. The NWI 50 may have a depth ranging from about 2 to 4, an example being 3, microns with a dopant concentration greater than a concentration of the dopant in the first rectangle, e.g., from about $10^{15}$ to $10^{17}$, an example being $2 \times 10^{16}$, atoms/cm$^3$. The PWI 55 may have a depth from about 2 to 4, an example being 3, microns with a concentration from about $10^{15}$ to $10^{17}$, an example being $3 \times 10^{16}$, atoms/cm$^3$. An N-type layer 60 (FIG. 1E) then may be formed at step 125 by implanting an N-type dopant (e.g., phosphorous or arsenic) after the drive-in of the N-type dopant and the P-type dopants at step 122 that form the NWI 50 and the PWI 55.

At step 130 a field oxide process may be performed in order to define, and isolate from each other, active regions (cf. emitter 10, base 15, and collector 20 regions in FIG. 1A). Patterning and implanting of atoms of an N-type dopant such as arsenic then may be performed at step 135 to form N+ emitter and collector regions (cf. emitter 10 and collector 20 in FIG. 1G) that extend through the N-type layer 60 into the third well, i.e., the PWI 55 (FIG. 1G). The emitter 10 and collector 20 may be doped to a higher concentration than that of the N-type layer 60, that is, a concentration ranging from about $10^{19}$ to $10^{21}$, an example being $2 \times 10^{20}$ atoms/cm$^3$, and depths of the emitter 10 and collector 20 regions may range from about 0.1 to 0.5, an example being 0.3, microns. A base region 15 (FIGS. 1A and 1G) that extends through the N-type layer 60 into the PWI 55 and having a depth from about 0.1 to 0.5, an example being 0.3, microns may be formed at step 140 by patterning and implanting atoms of P-type doping material such that the base region 15 is doped to a higher concentration than that of the PWI 55, a concentration from about $10^{19}$ to $10^{21}$, an example being $10^{20}$, atoms/cm$^3$.

Although the implementation in FIG. 2 of the method of the present invention describes fabrication of an NPN BJT, it will be clear to one skilled in the art that steps involving, respectively, N- and P-type material may be replaced with corresponding steps in which roles of N- and P-type material are interchanged in order to fabricate a PNP BJT.

Figure 3:
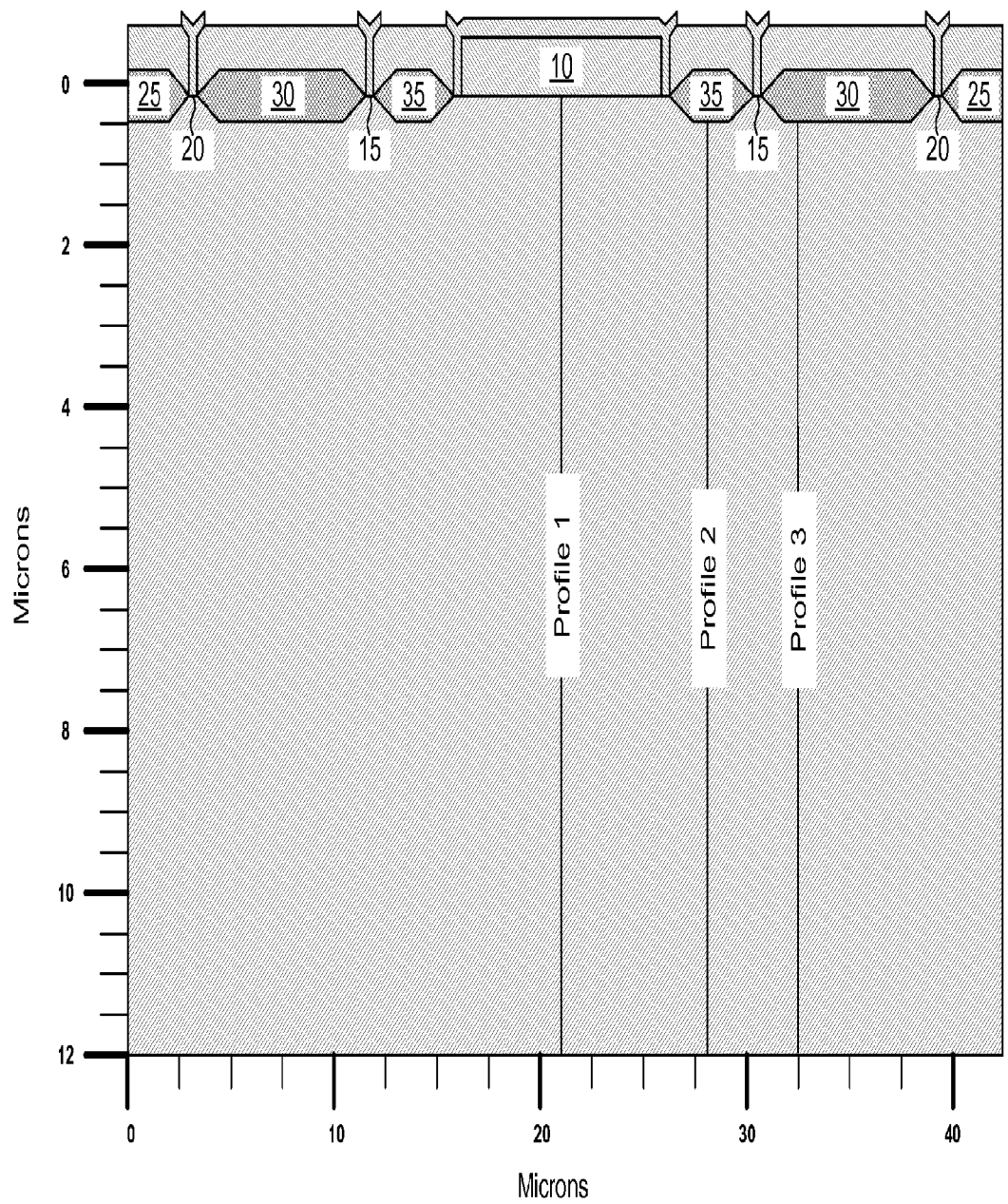
FIG. 3 is an alternative representation of the cross-sectional diagram of FIG. 1G that defines section lines for describing doping profiles.

Application of the FIG. 2 process to fabricate an NPN BJT may result in profiles of doping density depicted in FIGS. 3, 4A, 4B, and 4C. A diagram in FIG. 3 identifies, approximately to scale, three sections of the structure described above with reference to FIGS. 1A and 1G, the sections being taken along lines nominally in the plane defined by section 1G-1G' in FIG. 1A and identified as Profile 1, Profile 2, and Profile 3. Simulated doping densities for Profile 1, taken along a line passing through the emitter 10 in FIG. 3, are displayed in atoms/cm$^3$ on a chart in FIG. 4A. Doping density levels for phosphorus (N-type), boron (P-type), and arsenic (N-type) are presented on curves designated in FIG. 4A as, respectively, 200, 205, and 210. Net doping density is shown on a curve designated as 215.

Figure 4A:
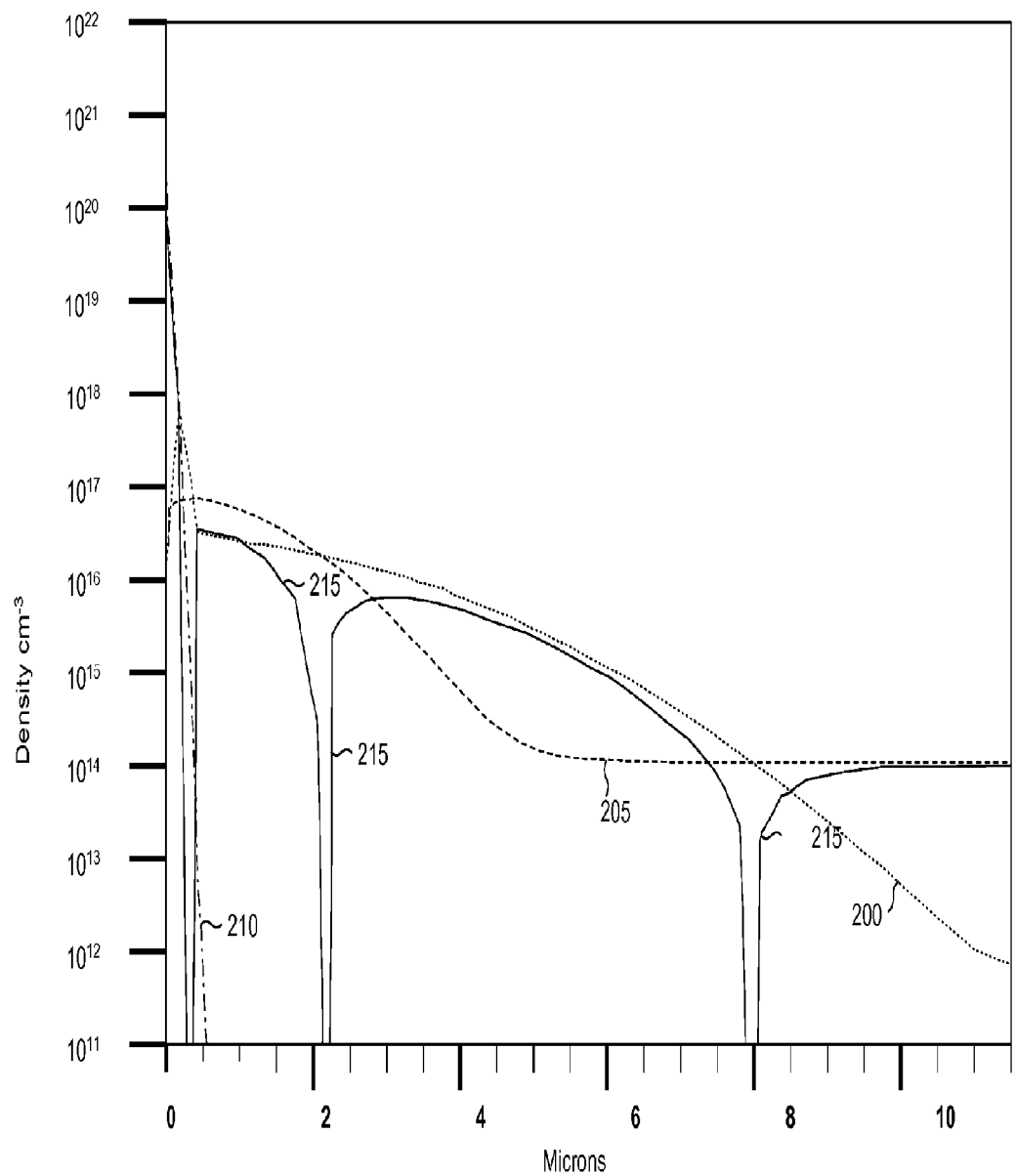
FIG. 4A is a chart illustrating doping profiles along a first section defined in FIG. 3 according to an embodiment of the present invention.
Figure 4B:
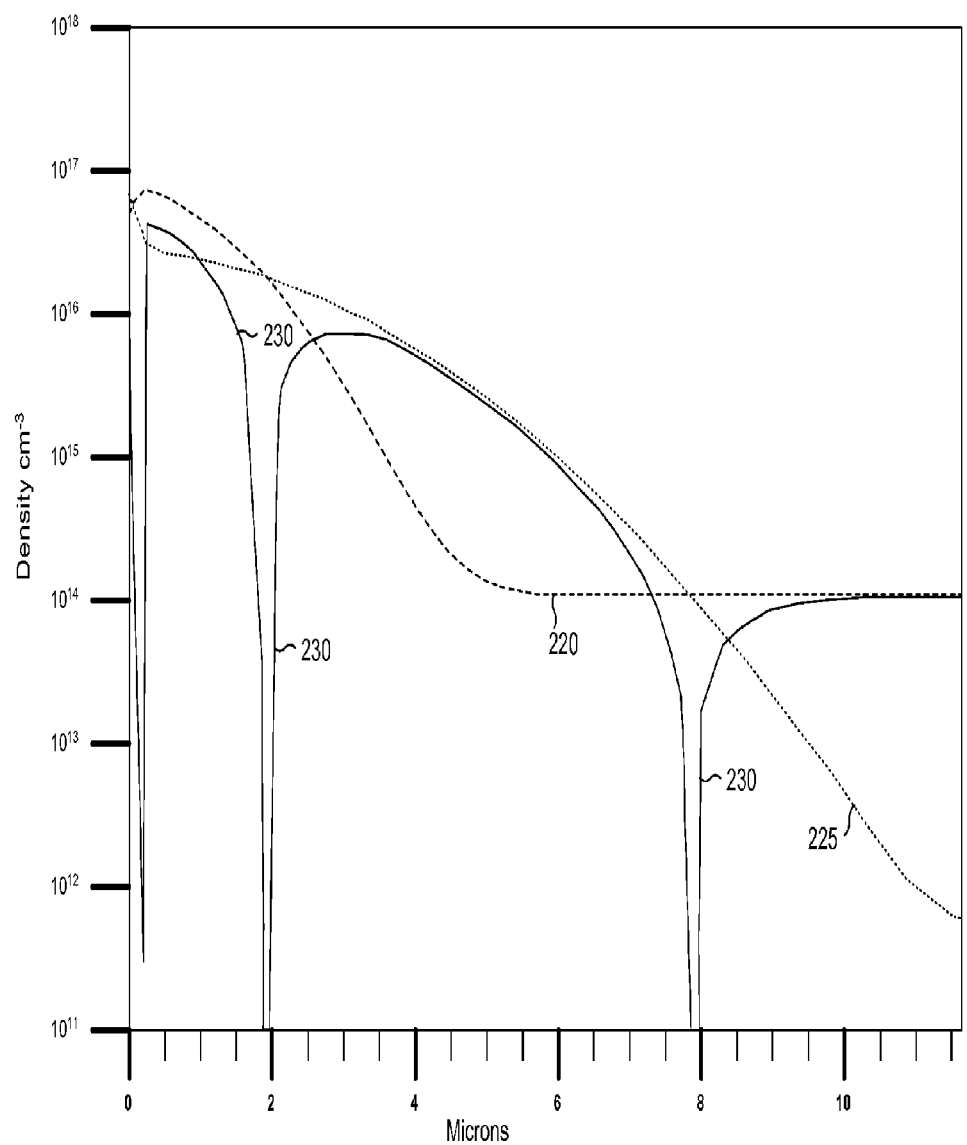
FIG. 4B is a chart illustrating doping profiles along a second section defined in FIG. 3 according to an embodiment of the present invention.
Figure 4C:
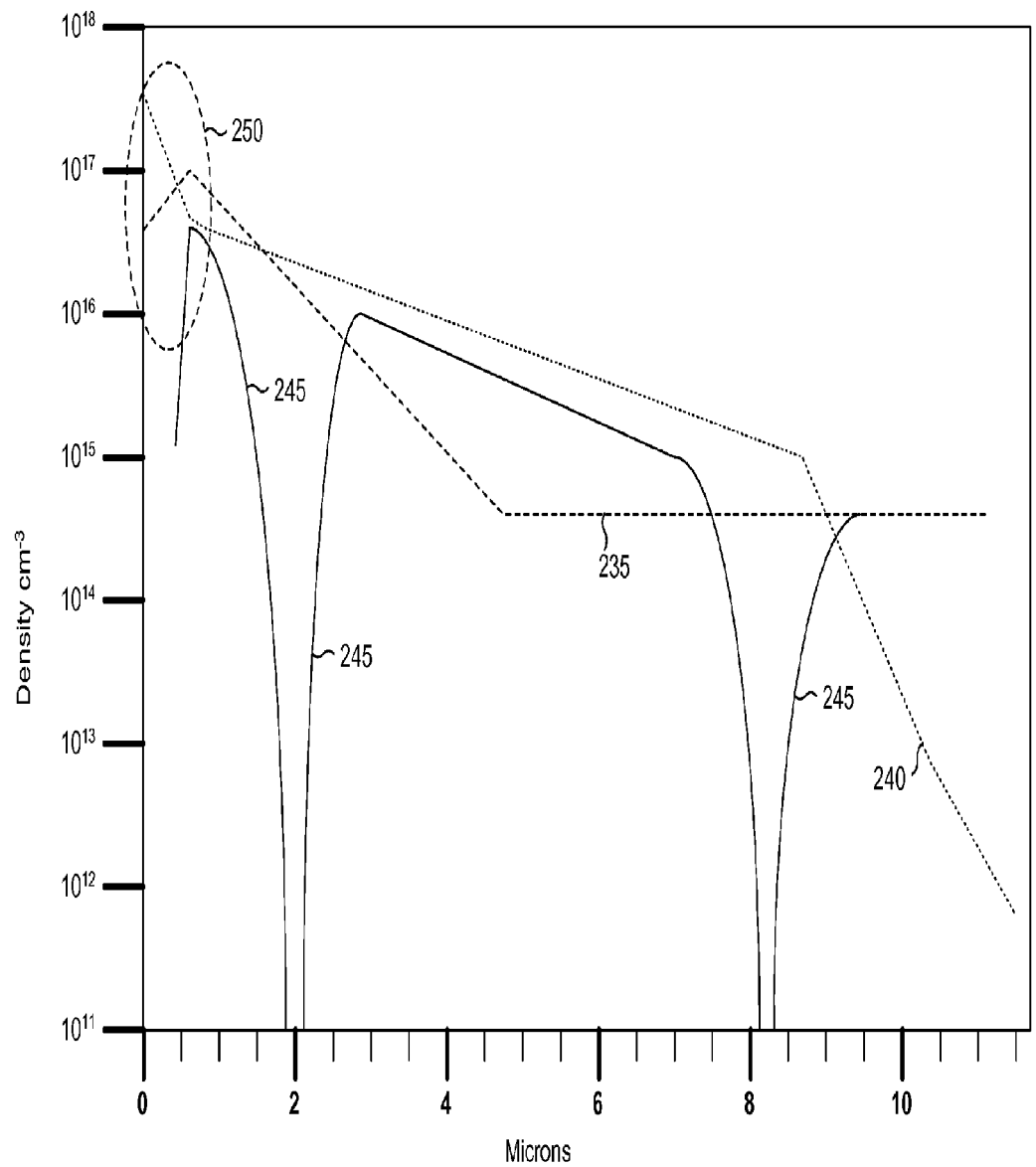
FIG. 4C is a chart illustrating doping profiles along a third section defined in FIG. 3 according to an embodiment of the present invention.

Simulated doping densities for Profile 2 (FIG. 3), taken along a line passing through a portion 35 of field oxide disposed between the emitter 10 and the base 15, are presented in FIG. 4B. Curves 220 and 225 represent doping densities for, respectively, boron and phosphorus; the curve 230 represents net doping density. Profile 3 (FIG. 3) is taken along a line passing through a portion 30 of field oxide lying between the base 15 and the collector 20. Doping densities for Profile 3 appear in FIG. 4C, in which respective boron and phosphorus densities are given in curves 235 and 240. Net doping density is identified with curve 245 in the figure.

Figure 5A:
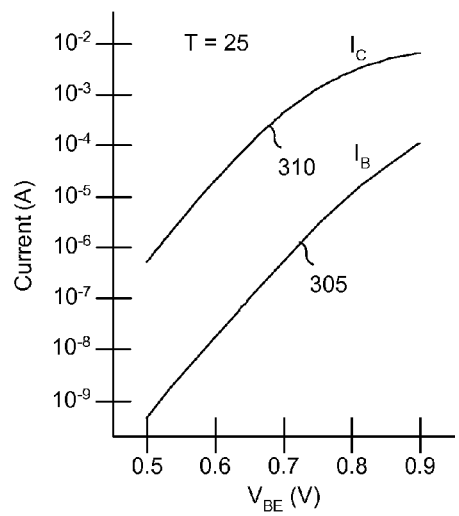
FIG. 5A is a chart illustrating base-emitter current transfer characteristics of an embodiment of the present invention at a temperature of 25 degrees C.
Figure 5B:
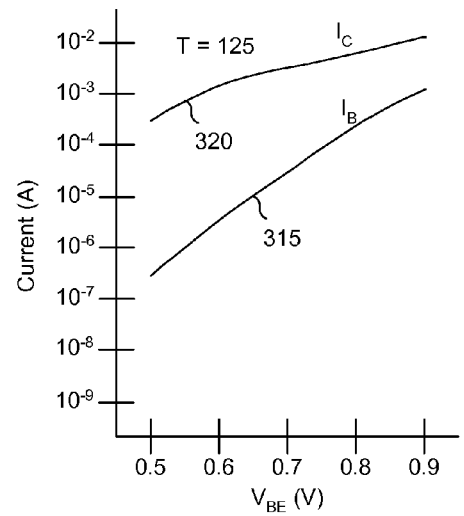
FIG. 5B is a chart illustrating base-emitter current transfer characteristics of an embodiment of the present invention at a temperature of 125 degrees C.

Performance characteristics of sample embodiments of an NPN BJT fabricated according to the present invention are shown in FIGS. 5A, 5B, 6A, 6B, 7A, and 7B. FIG. 5A illustrates, at a temperature of 25 degrees C., in a first curve 305, an input characteristic showing base current $I_B$ as a function of base-to-emitter voltage $V_{BE}$. FIG. 5A also illustrates, in a second curve 310, a transfer characteristic depicting collector current $I_C$ as a function of $V_{BE}$. FIG. 5B illustrates the same input characteristic (curve 315) and transfer characteristic (curve 320) as FIG. 5A, but at a temperature of 125 degrees C.

Figure 6A:
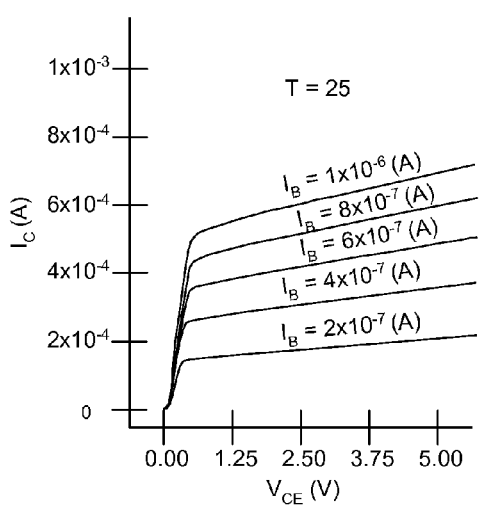
FIG. 6A is a chart depicting collector characteristics of an embodiment of the present invention at a temperature of 25 degrees C.
Figure 6B:
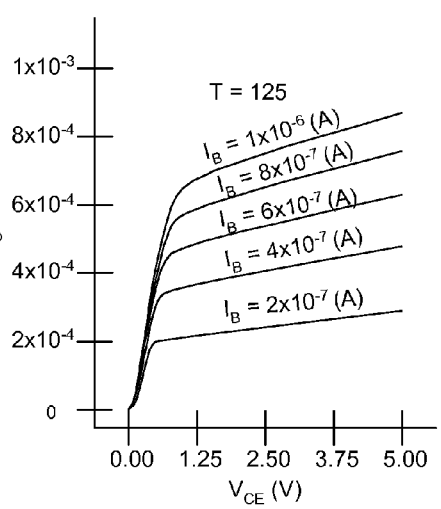
FIG. 6B is a chart depicting collector characteristics of an embodiment of the present invention at a temperature of 125 degrees C.

FIG. 6A is a chart illustrating a family of collector characteristics showing a relationship of collector current $I_C$ and collector-to-emitter voltage $V_{CE}$ with base current $I_B$ as a parameter, all at a temperature of 25 degrees C. FIG. 6B presents the same information as FIG. 6A at a temperature of 125 degrees C.

FIG. 7A is a plot of beta ($I_C/I_B$) as a function of collector current $I_C$ at a temperature of 25 degrees C. The same plot is repeated in FIG. 7B at a temperature of 125 degrees C.

Experimental breakdown voltages between emitter and base ($BV_{EBO}$), collector and emitter ($BV_{CEO}$), and collector and base ($BV_{CBO}$) for four samples of NPN BJTs formed according to the present invention are presented in Table 1 below. The samples were fabricated with a square emitter area of $10 \times 10 = 100\,\mu m^2$. It may be noted that all entries in the table exceed 10 V. In particular, the minimum collector-to-emitter breakdown voltage $BV_{CEO}$ of all the samples is 11.5 V.

TABLE 1

|  | Sample 1 | Sample 2 | Sample 3 | Sample 4 |
|---|---|---|---|---|
| $BV_{EBO}$ | 36.0 | 36.0 | 34.0 | 34.5 |
| $BV_{CEO}$ | 13.0 | 14.0 | 11.5 | 13.0 |
| $BV_{CBO}$ | 28.5 | 28.5 | 28.5 | 27.5 |

It may be observed in, for example, FIGS. 7A and 7B that beta values exceeding 1000 are achieved by embodiments of the NPN BJT fabricated according to the present invention. The present invention, therefore, can implement NPN BJTs having significantly higher values of beta relative to $BV_{CBO}$ and $BV_{CEO}$ than are predicted by a known general formula pertaining to NPN BJTs fabricated according to conventional methods:

$$BV_{CEO} = \frac{BV_{CBO}}{\sqrt[n]{\beta}} \quad (\text{Eq. 1})$$

or $$\beta = \left(\frac{BV_{CBO}}{BV_{CEO}}\right)^n \quad (\text{Eq. 2})$$

where n is a constant ranging from about 3 to about 6. Taking representative $BV_{CEO}$ and $BV_{CBO}$ values from Table 1, choose $$BV_{CEO} = 13$$

and $$BV_{CBO} = 28.5,$$

from which values of β can be expected to range from about $$\left(\frac{28.5}{13}\right)^3 = 10.53\ldots$$

with n=3 to about $$\left(\frac{28.5}{13}\right)^6 = 100.02\ldots$$

with n=6.

The present invention, therefore, can facilitate the manufacture of NPN BJTs having values of beta that are about 10 to 100 times larger than the beta predicted by the known general formula.

Figure 8A:
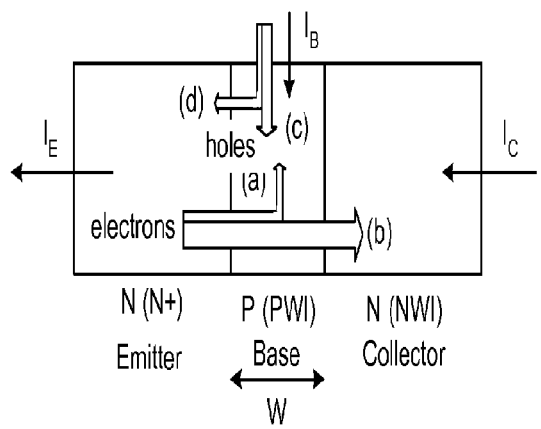
FIG. 8A is a diagram illustrating operation of a prior-art NPN BJT of generic form.
Figure 8B:
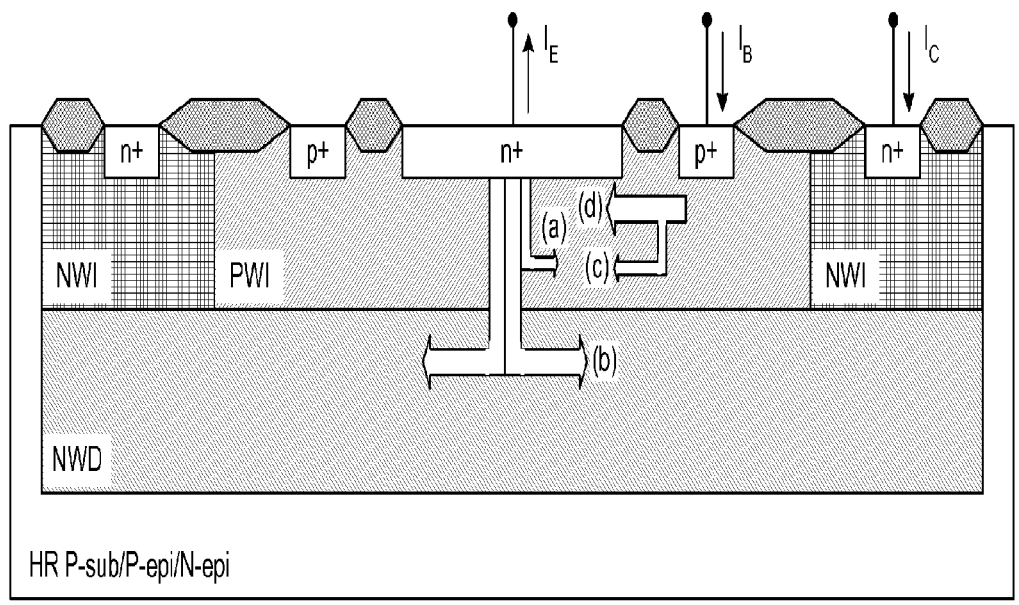
FIG. 8B is a cross-sectional diagram of an NPN BJT having a geometry similar to that of the present invention.

FIGS. 8A and 8B illustrate operation of prior-art NPN BJTs according to known principles. FIG. 8A shows a generic NPN BJT having an N-type emitter comprising an N+ region, a P-type base comprising a PWI and having a width W, and an N-type collector comprising an NWI wherein a base current $I_B$ enters the base, a collector current $I_C$ enters the collector, and an emitter current $I_E = I_C + I_B$ leaves the emitter. Within the emitter the emitter current is carried predominantly by majority carriers, i.e., electrons. A first portion (a) of electrons that enter the base from the emitter recombine with holes in the P-type base. Electrons in a (usually larger) second portion (b) traverse across the relatively narrow base region and arrive in the collector. Within the base the predominant base current is carried by majority carriers (c), i.e., holes, a portion of which recombine with the electrons (a) that are injected from the emitter. Electrons (d) in a remaining portion of the base current are injected from the base into the emitter. Generally, when holes and electrons recombine in the base region, fewer electrons are injected into the collector as collector current $I_C$, thereby reducing current gain, $\beta = I_C/I_B$. This reduction relates to $BV_{CEO}$, as is quantified above in Eqs. 1 and 2. One way of increasing $BV_{CEO}$ is to increase base width W (FIG. 8A). However, increasing base width W increases recombination of holes and electrons in the base causing a reduction in β.

FIG. 8B is an illustration of the effects just described relative to FIG. 8A but related to a geometrical form of transistor more closely related to that of the present invention than is the form shown in FIG. 8A. Again, recombination of electrons and holes between the base and emitter regions has an effect of reducing β.

Figure 8C:
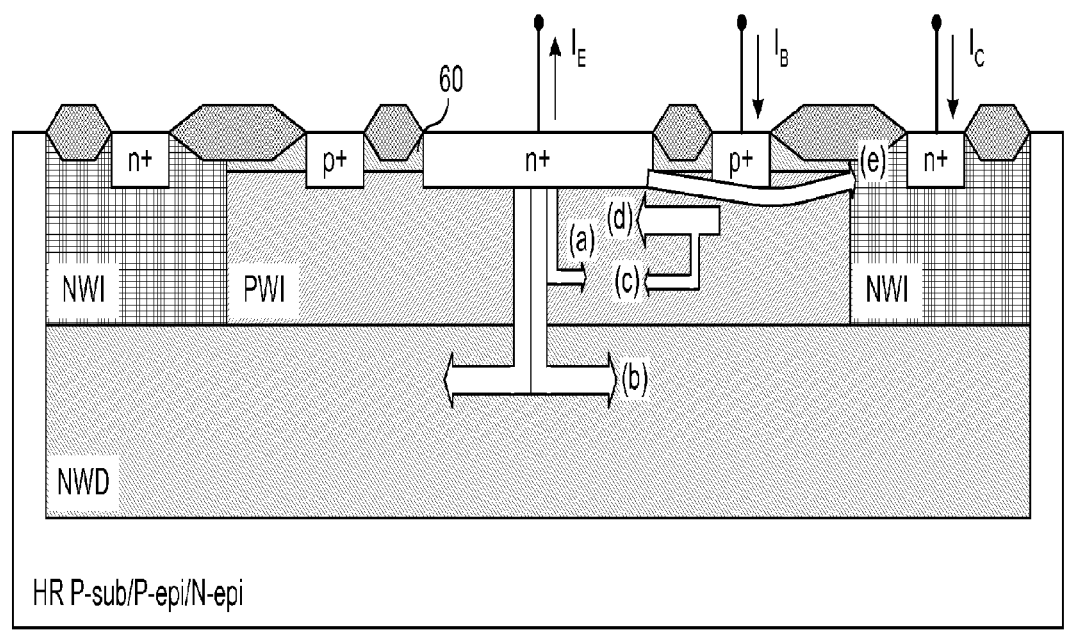
FIG. 8C is a cross-sectional diagram of an NPN BJT fabricated according to the present invention illustrating an effect that may act to increase beta.

FIG. 8C illustrates an embodiment of NPN BJT fabricated according to the present invention, which embodiment includes the N-type layer 60 described above. As illustrated, the N-type layer 60 provides an alternate path, i.e., a "short circuit" (e) through which electrons emitted by the emitter can reach the collector. This short circuit decreases the effect of recombination of holes and electrons, thereby increasing collector current, which increases the value of β.

In view of the foregoing, it will be understood by those skilled in the art that the methods of the present invention can facilitate formation of bipolar junction transistors (BJTs), and, in particular, NPN BJTs having a large beta with a breakdown voltage exceeding 10 V, in an integrated circuit. Although the disclosure herein refers to certain illustrated embodiments, it is to be understood that these embodiments have been presented by way of example rather than limitation. For instance, in non-equivalent, non-interchangeable, modified embodiments, any one or more of the rectangular shapes may comprise other boundaries, such as those having more or fewer sides than four, those having curved or other (e.g., complex) sides and/or shapes, and/or even those that are not closed-boundaries (e.g., boundaries that do not entirely encircle or surround a central, interior, inner, or other region). The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method, comprising:
providing a base wafer;
implanting atoms of a first conductivity type as a dopant into a region of the base wafer;
driving the implanted atoms to a depth sufficient to form a first well;

patterning and implanting atoms of the first conductivity type to form a second well inside the region to a dopant concentration greater than a concentration of the dopant in the region;

patterning and implanting atoms of a second conductivity type to form a third well inside the second well; and patterning and implanting atoms of the first conductivity type to form a layer overlying the third well;

driving the implanted atoms to a depth sufficient to form the second well and the third well by subjecting the wafer to a high temperature greater than about 1000 degrees C.;

performing a field oxide process that defines an emitter region having a rectangular shape disposed in a center portion of the layer, a base region having a shape of a rectangular ring surrounding and concentric with the emitter region, and a collector region having a shape of a rectangular ring surrounding and concentric with the base region, the emitter region, the base region and the collector region being isolated from each other;

patterning and implanting atoms of the first conductivity type in the emitter and collector regions, whereby the emitter and collector regions are doped to a higher concentration than that of the layer and whereby the emitter extends through the layer into the third well and the collector region extends into the second well; and patterning and implanting atoms of the second conductivity type in the base region, whereby the base region is doped to a higher concentration than that of the third well and whereby the base region extends through the layer into the third well.

2. The method as set forth in claim 1, wherein: the implanting of atoms of the first conductivity type comprises implanting atoms of N-type material; and the implanting of atoms of the second conductivity type comprises implanting atoms of P-type material.

3. The method as set forth in claim 2, wherein the driving comprises driving the implanted atoms to a depth sufficient to form an N-well and a P-well.

4. A bipolar junction transistor formed according to the method set forth in claim 1.

5. The bipolar junction transistor as set forth in claim 4, wherein the transistor exhibits a beta between 300 and 1200.

6. The bipolar junction transistor as set forth in claim 5, wherein the transistor exhibits: a beta greater than 1000; and a collector-to-emitter breakdown voltage greater than 10 volts.

7. The method as set forth in claim 1, wherein: the atoms of first conductivity type are implanted into the base wafer in a form of a first rectangle; the implanted atoms are driven by subjecting the wafer to a temperature of about 1150 degrees C. for about 12 hours; and the second well has a shape of a rectangular ring inside the first rectangle.

\* \* \* \* \*